United States Patent [19]

Fischer

[11] 4,282,482

[45] Aug. 4, 1981

[54] METHOD AND APPARATUS FOR PHASE DETECTION HAVING A NARROW DEAD BAND AND A LINEAR OUTPUT

[75] Inventor: Michael C. Fischer, Santa Clara, Calif.

[73] Assignee: Hewlett-Packard Company, Palo Alto, Calif.

[21] Appl. No.: 49,539

[22] Filed: Jun. 18, 1979

[51] Int. Cl.³ .............................................. G01R 25/00
[52] U.S. Cl. .................................. 324/83 A; 324/83 D
[58] Field of Search ................ 324/83 R, 83 A, 83 D, 324/140 R, 140 D

[56] References Cited

U.S. PATENT DOCUMENTS

| 3,414,816 | 12/1968 | Tobey et al. | 324/83 A |
| 3,854,117 | 12/1974 | Fothergill | 324/83 A |
| 4,017,801 | 4/1977 | Riedel | 324/83 A |
| 4,025,848 | 5/1977 | Delagrange | 324/83 A |
| 4,128,812 | 12/1978 | Pavlis | 324/83 D |

Primary Examiner—Michael J. Tokar
Attorney, Agent, or Firm—David A. Boone

[57] ABSTRACT

Two input signals of uncertain phase relationship are applied to trigger circuits which develop sharply defined logic level transitions in response to the input signals crossing predetermined amplitude threshold levels. These logic level transitions are then used to clock a register whose outputs are gated and filtered to provide a DC output signal whose level indicates the phase difference between the two input signals.

3 Claims, 5 Drawing Figures

METHOD AND APPARATUS FOR PHASE DETECTION HAVING A NARROW DEAD BAND AND A LINEAR OUTPUT

BACKGROUND AND SUMMARY

Phase detection circuits have been used to detect the relative phase of two input signals. Some of these circuits have converted the analog input signals into digital signals through threshold triggering at some preselected signal amplitude value. Further processing and filtering of the resulting signals was used to provide an output signal which was indicative of the relative phase of the two input signals. These prior techniques were limited to their usefulness because of their poor linearity particularly in the dead band region, i.e., that region where the two signals were very close in phase.

In accordance with the preferred embodiments of the present invention, two input signals having an unknown phase relationship are input to threshold trigger circuits which provide two digital signals in response thereto. These digital signals are input to an interactive flip-flop register. This interactive register provides an output signal whose duty cycle corresponds to the phase difference of the input signals. This output signal is then filtered to provide a DC output signal which varies between two predetermined voltages in correspondence with the relative phase difference. The preferred embodiment thus provides improved linearity with a very narrow dead band. Contributing to this improvement is the fact that this invention allows the logic circuits to operate at one-half the input frequency.

DESCRIPTION OF THE PREFERRED EMBODIMENT

Figure 1:
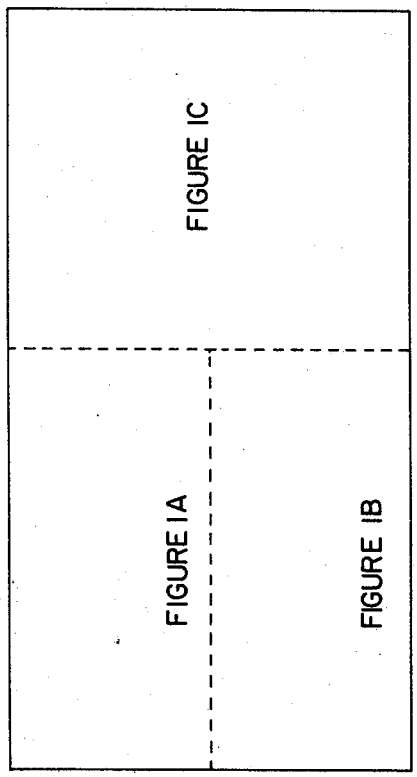
FIGS. 1, 1A-1C are a schematic diagram of the preferred embodiment.
Figure 1A:
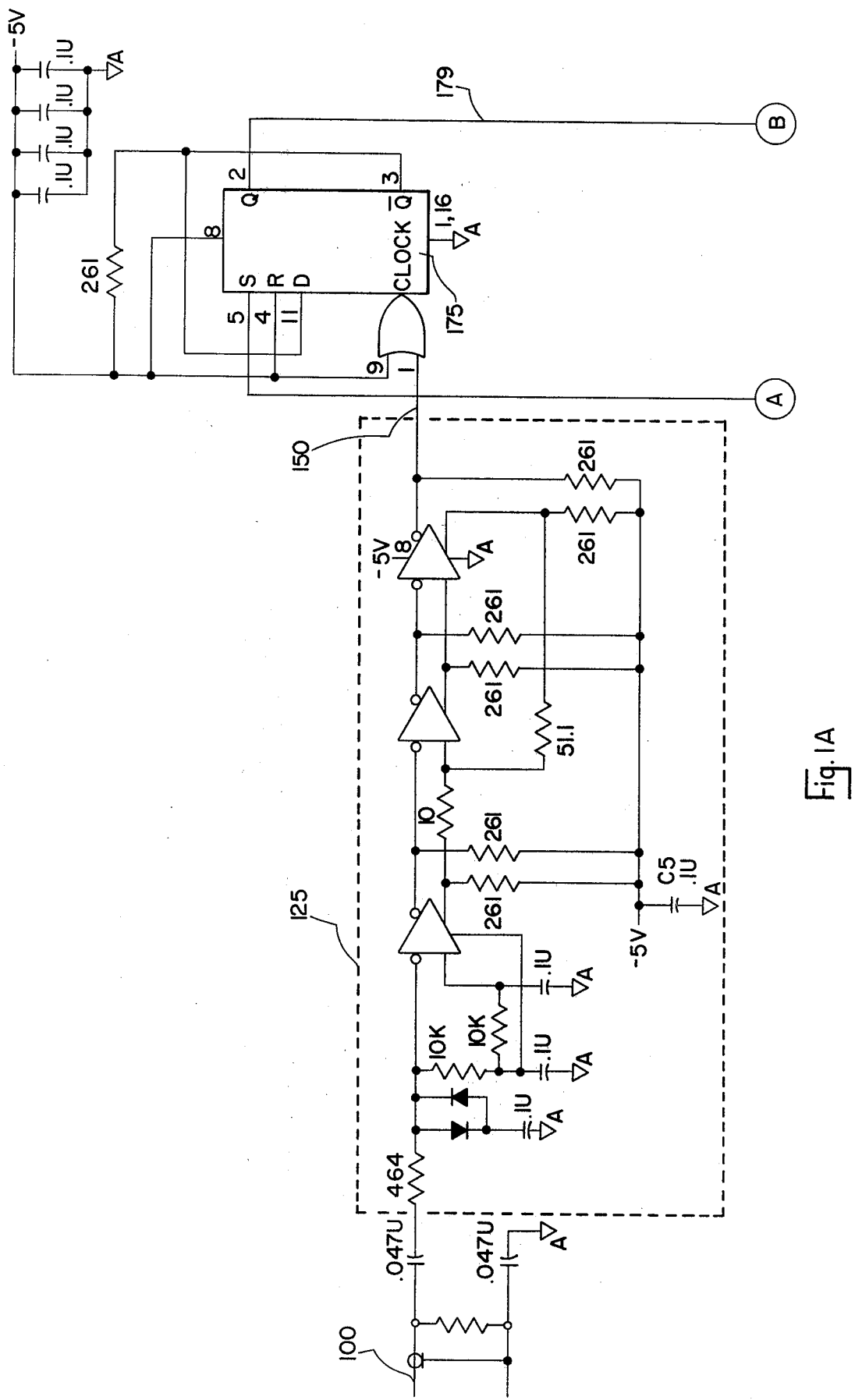
Figure 1B:
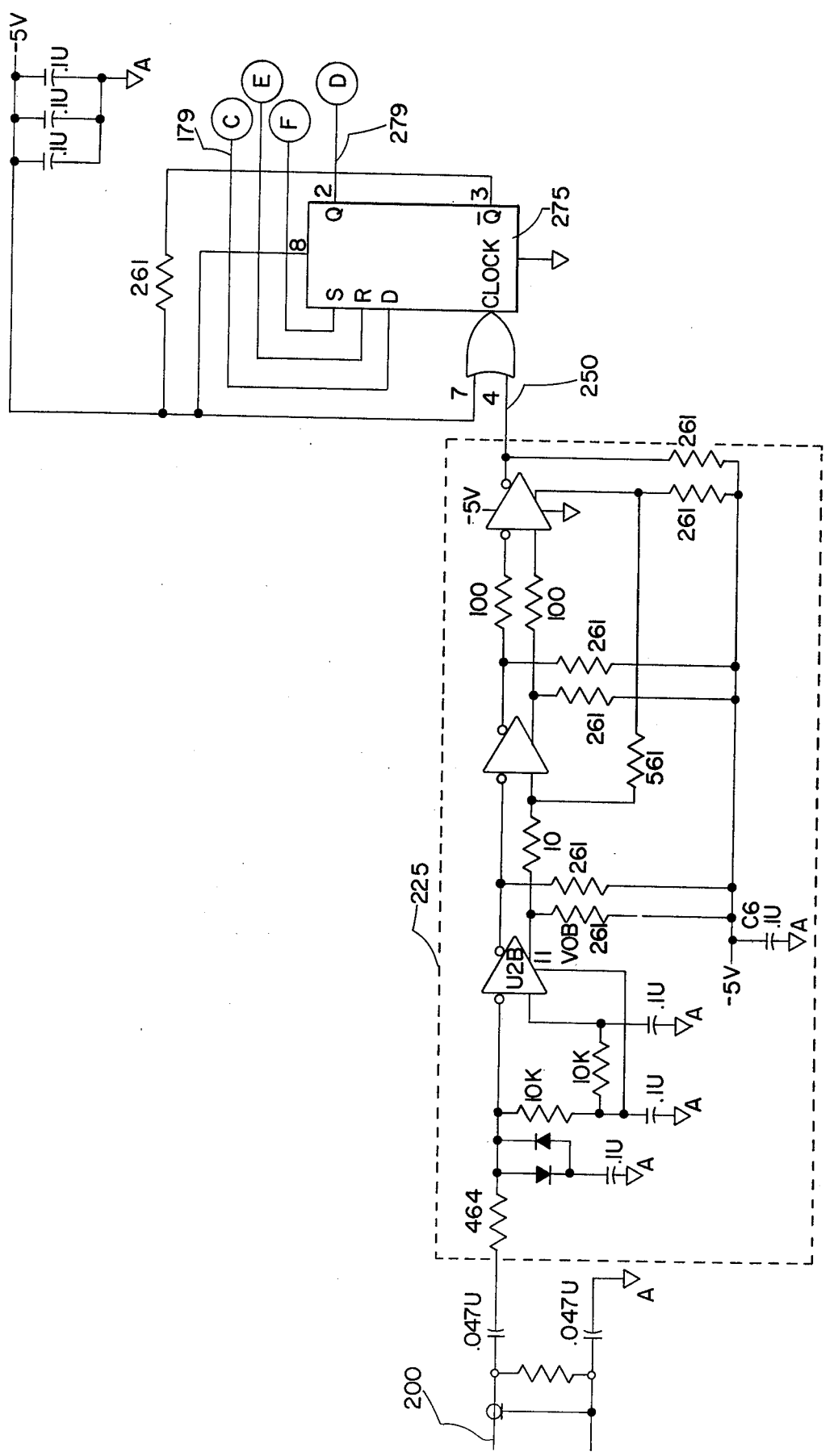
Figure 1C:
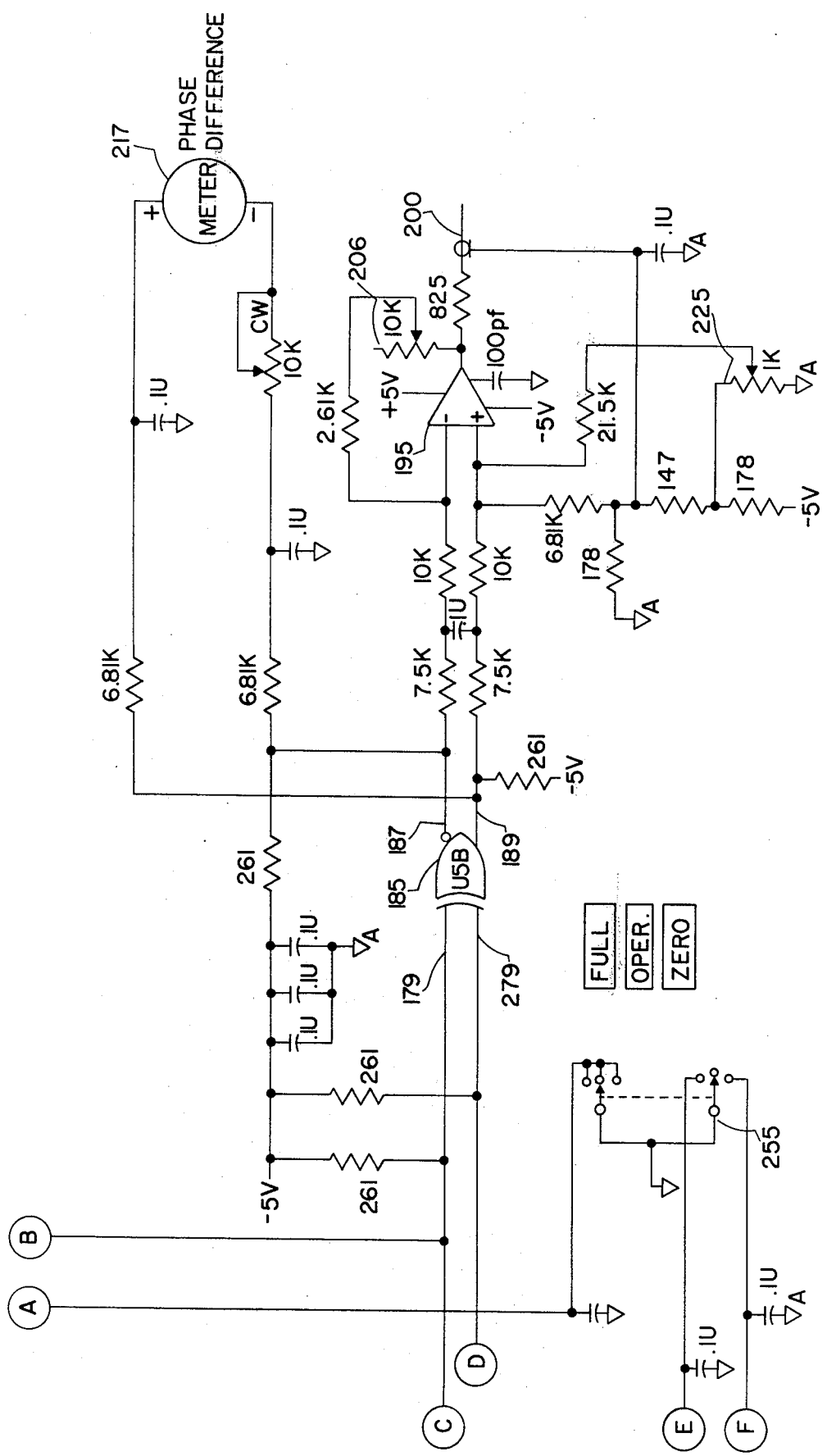

Referring now to FIG. 1, there is shown a schematic diagram of the preferred embodiment. A first input signal is received on line 100, while a second input signal is received on line 200. The first input signal received on line 100 is processed by threshold trigger circuitry 125. In the preferred embodiment a digital high signal is provided on line 150 each time the input signal received on line 100 increases beyond the threshold voltage level. In the preferred embodiment this value is within 10 mV of the DC average value of the signal, or zero crossing level. In a corresponding manner, a digital low signal is provided on line 150 each time the input signal on line 100 falls below the threshold trigger level. Threshold trigger level circuit 225 operates in a similar manner in response to the input signal received on line 200 to provide a digital high and low signal level on line 250. In this way, digital signals are provided on lines 150 and 250 which correspond to the transitions of the input signals received on lines 100 and 200 through the threshold value, respectively. Hysteresis in the trigger level circuit offers beneficial effects and is included in the circuitry of the preferred embodiment.

The digital signals thus generated on lines 150 and 250 are input to the clock inputs of flip-flops 175 and 275 respectively. Flip-flops 175 and 275 are edge triggered D flip-flops. The $\overline{Q}$ output of flip-flop 175 is provided to the D input of flip-flop 175. The Q output of flip-flop 175 is provided as the D input to flip-flop 275 on a line 179. The $\overline{Q}$ output of flip-flop 175 is also provided to exclusive-or gate 185. The Q output of flip-flop 275 is provided on a line 279 to the other input of exclusive-or gate 185. Exclusive-or gate 185 provides complementary logic outputs on lines 187 and 189. An output signal on line 200 is provided after the signals on lines 187 and 189 have been low-pass filtered, level-shifted, and amplified by the circuit comprising operational amplifier 195 and its associated components. Adjustment of the full scale output from operational amplifier 195 is provided through potentiometer 206. The zero scale adjustment is provided by potentiometer 225; switch 255 is used to force the full-scale and zero output conditions to facilitate adjustment of potentiometers 206 and 225, or allow normal operation in its center position. Switch 255 forces the zero and full-scale conditions by applying the necessary digital high and low signals to the set and reset inputs of flip-flops 175 and 275. These set and reset inputs supercede the effect of any inputs which may be present at the D and clock inputs. An additional output display of the phase difference is provided by meter 217.

Figure 2:
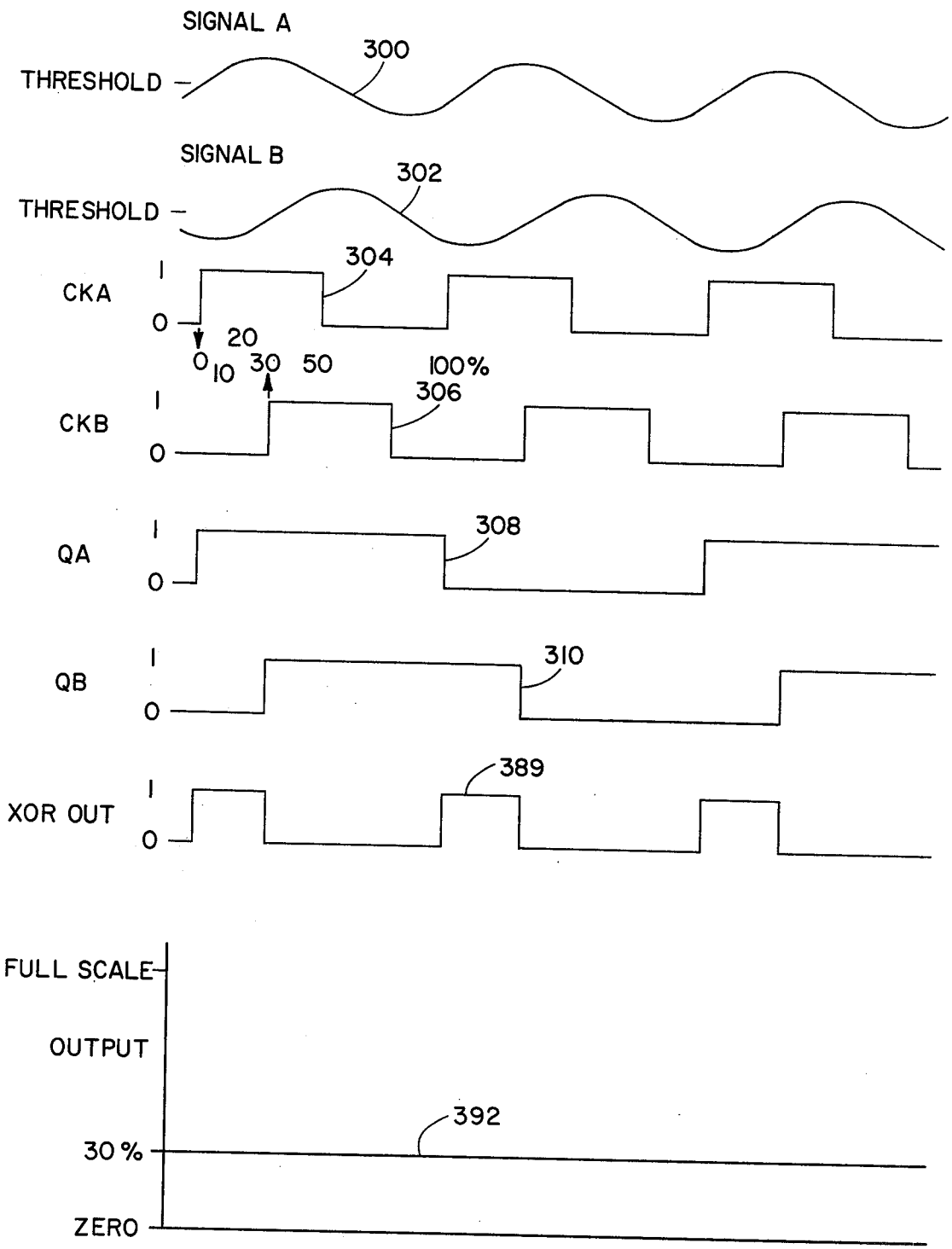
FIG. 2 is a timing diagram illustrating the signal waveforms of the preferred embodiment.

Referring now to FIG. 2, there are shown typical waveforms for the circuit of FIG. 1. The signal received on line 100 of the circuit of FIG. 1 is shown as waveform 300. The signal received on line 200 is shown as waveform 302. Waveform 304 is provided on line 150 by threshold trigger circuit 125 in response to the signal with waveform 300 received on line 100. In a similar manner, waveform 306 is provided by threshold trigger circuit 225 on line 250 in response to the signal having a waveform 302 which is received on line 200. The Q output on line 179 provides the waveform 308 in response to waveform received on line 150. Similarly, flip-flop 275 provides waveform 310 on line 279. These two signals, i.e. signals on line 179 and 279 having waveforms 308 and 310 respectively as shown in FIG. 2 are exclusive-ored by gate 185 to provide the output signal on lines 187 and 189. The output signal on line 189 has a waveform similar to waveform 389 in FIG. 2. The waveform on line 187 of course has a complementary waveform. The waveform on line 189 is then filtered, averaged, and processed to provide the DC output signal on line 200 which is a DC output level which varies between zero volts and a predetermined full scale voltage as shown by waveform 392.

I claim:

1. Phase detection apparatus comprising:
   first input channel means for providing a first logic signal in response to transitions of a first input signal above and below a first preselected amplitude level;
   second input channel means for providing a second logic signal in response to transitions of a second input signal above and below a second preselected amplitude level;
   digital circuit means coupled to said first and second input channel means for providing a digital signal having a duty cycle which corresponds to the relative phase relationship of said first and second input signals, said digital circuit means comprising first flip-flop means having a first data input, and a first data output; said clock input being coupled to said first input signal channel, said data input being coupled to said data output;

second flip-flop means coupled to said first flip-flop means and having a second clock input, a second data input, a second data output, said clock input being coupled to said second input channel for receiving said second logic signal, said data input coupled to said data output of said first flip-flop means;

filtering means coupled to said digital circuit means for providing a direct current (DC) output signal having an amplitude corresponding to said phase relationship of said first and second input signals in response to said digital signal; and meter means for providing an indication of the relative phase of said first and second input signals in response to said DC output signal.

2. Apparatus as in claim 1 wherein said digital means comprises a first logic means coupled to said first and second flip-flop means for providing an output logic signal in response to the performing of an EXCLUSIVE-OR logical operation on signals from the data outputs of said first and second flip-flop means.

3. Apparatus as in claim 2 wherein said filtering means further comprises low-pass filter coupled to said first logic means for providing said DC output signal in response to said output logic signal.

* * * * *

UNITED STATES PATENT AND TRADEMARK OFFICE
CERTIFICATE OF CORRECTION

PATENT NO. : 4,282,482

DATED : August 4, 1981

INVENTOR(S) : Michael C. Fischer

It is certified that error appears in the above—identified patent and that said Letters Patent is hereby corrected as shown below:

Column 2, line 64, after the word "means" insert -- further --;

line 65, after the words "flip-flop means having a first" insert --clock input, a first --

Signed and Sealed this

Twenty-fifth Day of May 1982

[SEAL]

Attest:

GERALD J. MOSSINGHOFF

Attesting Officer     Commissioner of Patents and Trademarks